United States Patent
Nielsen et al.

(10) Patent No.: US 11,418,890 B1
(45) Date of Patent: Aug. 16, 2022

(54) DIGITAL SENSORS, ELECTRICAL CIRCUITS AND METHODS

(71) Applicant: Knowles Electronics, LLC, Itasca, IL (US)

(72) Inventors: Allan Nielsen, Roskilde (DK); Emil Jakobsen, Kongens Lyngby (DK); Per F. Høvesten, Måløv (DK)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 14 days.

(21) Appl. No.: 17/231,511

(22) Filed: Apr. 15, 2021

(51) Int. Cl.
| | | |
|---|---|---|
| *H04R 19/04* | (2006.01) | |
| *H04R 3/00* | (2006.01) | |
| *H03F 3/45* | (2006.01) | |
| *H03M 3/00* | (2006.01) | |

(52) U.S. Cl.
CPC ......... *H04R 19/04* (2013.01); *H03F 3/45475* (2013.01); *H03M 3/458* (2013.01); *H04R 3/00* (2013.01); *H04R 2201/003* (2013.01)

(58) Field of Classification Search
CPC .... H04R 19/04; H04R 3/00; H04R 2201/003; H03F 3/45475; H03M 3/458
See application file for complete search history.

(56) References Cited

U.S. PATENT DOCUMENTS

| | | | | |
|---|---|---|---|---|
| 9,332,345 B1* | 5/2016 | Melanson | ................. | H04R 3/02 |
| 9,641,192 B1* | 5/2017 | Onishi | .................... | H04R 3/06 |
| 2005/0151680 A1* | 7/2005 | Kearney | ................ | H03M 1/186 |
| | | | | 341/172 |
| 2010/0066577 A1* | 3/2010 | Huang | ................ | H03M 1/0663 |
| | | | | 341/143 |
| 2016/0233874 A1* | 8/2016 | Stojanovic | ............ | H03M 3/368 |
| 2020/0183539 A1* | 6/2020 | Kang | .................... | G06F 3/0418 |
| 2020/0220510 A1* | 7/2020 | Garcia Gonzalez | ...... | H03F 3/38 |

FOREIGN PATENT DOCUMENTS

EP    2256933 B1 *  5/2012  ......... H03K 17/0416

OTHER PUBLICATIONS

Crols, J. et al., "Switched-Opamp: An Approach to Realize Full CMOS Switched-Capacitor Circuits at Very Low Power Supply Voltages," IEEE Journal of Solid-State Circuits, vol. 29, No. 8, Aug. 1994, pp. 936-942.

* cited by examiner

*Primary Examiner* — David L Ton
(74) *Attorney, Agent, or Firm* — Foley & Lardner LLP

(57) ABSTRACT

The disclosure relates to microphone and other sensor assemblies having a transduction element and an integrated circuit. The integrated circuit includes a switched-capacitor delta-sigma analog-to-digital converter (ADC) including a first integrator stage having a switched-capacitor circuit and a first plurality of parallel amplifiers. A logic circuit coupled to the integrator circuit is configured to selectably disable a subset of enabled amplifiers of the first integrator stage during a first phase of operation and to re-enable the subset of disabled amplifiers during a second phase.

20 Claims, 6 Drawing Sheets

DIGITAL SENSORS, ELECTRICAL CIRCUITS AND METHODS

FIELD OF THE DISCLOSURE

The present disclosure relates generally to digital sensor assemblies and more specifically to sensor assemblies having switched-capacitor (SC) delta-sigma (ΔΣ) analog-to-digital converter (ADC) circuits, ADC circuits for such sensors and other applications, and methods of operating the same.

BACKGROUND

Microphones generally comprise a transducer that generates an electrical signal representing sound detected by the transducer. In digital microphones and other sensors, an analog signal generated by the transducer is converted into a digital signal by an analog-to-digital converter (ADC) that samples and quantizes the analog signal. The ADC may be implemented as a switched-capacitor (SC) delta-sigma (ΔΣ) ADC having integrator stages with parallel amplifiers that are switched in and out based on the operating frequency. The signal-to-noise ratio (SNR) of the digital signal can be increased by noise shaping an oversampled input signal. However, higher sampling rates require enabling more amplifiers to ensure proper settling of the integrator stages. Absent adequate settling, quantization noise begins to dominate. Thus the ADC can be a substantial source of power consumption.

BRIEF DESCRIPTION OF THE DRAWINGS

The objects, features and advantages of the present disclosure will become more fully apparent from the following description and appended claims, taken in conjunction with the accompanying drawings. The drawings depict only representative embodiments and are therefore not considered to limit the scope of the disclosure, the description of which includes additional specificity and detail.

Figure 1:
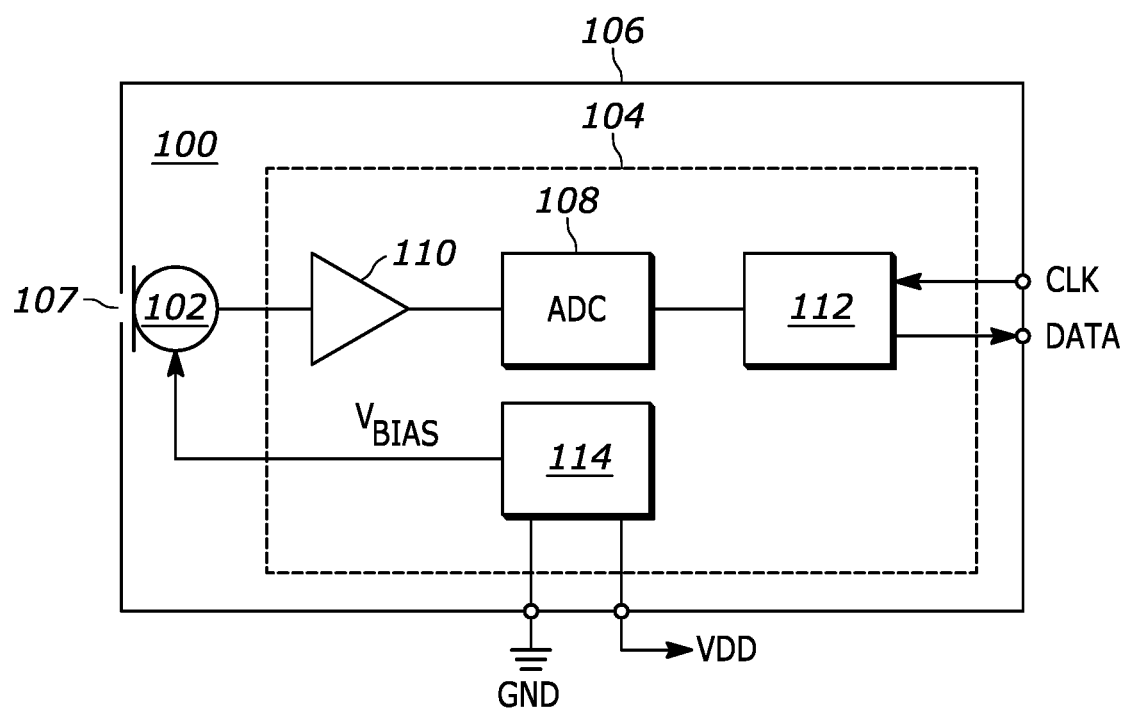
FIG. 1 is a block diagram of a sensor including a delta-sigma analog-to-digital converter (ADC) circuit.

Those of ordinary skill in the art will appreciate that elements in the drawings are illustrated for simplicity and clarity and may thus be disproportionate or omit elements unnecessary for conveying how to make and use the subject matter disclosed, that acts or steps described or depicted in a particular order may be performed in a different order or sequence absent a contrary indication, and that the terms and expressions herein have the meaning ordinarily accorded to such terms and expressions by those having ordinary skill in the art except where other meanings have otherwise been defined herein.

DETAILED DESCRIPTION

The present disclosure describes digital sensor devices and electrical circuits comprising switched-capacitor (SC) delta-sigma (ΔΣ) ADC circuits for such devices and other applications having improved power efficiency without compromising sampling rates required for higher signal-to-noise ratio (SNR), and methods of operation of such sensors and circuits. The sensor device generally comprises a sensor (i.e., a transduction element) coupled to an electrical circuit comprising a SC delta-sigma ADC for converting the analog electrical signal to a digital signal as described herein. The sensor device can be configured to detect sound, vibration, pressure, temperature, gas, and humidity among other conditions. The transduction element can be capacitive, piezo or optical among other known and future transduction elements capable of generating an electrical signal in response to a sensed environmental condition like sound. Such sensors can be fabricated using microelectromechanical systems (MEMS) or some other known or future technology.

In FIG. 1, the sensor device comprises a transduction element 102 and an electrical circuit 104 comprising a switched-capacitor (SC) delta-sigma (ΔΣ) analog-to-digital converter (ADC) 108 coupled to the transduction element. The ADC can be coupled to transduction element by a low noise interface circuit 110. The particular configuration of the interface circuit depends on the type and configuration of the transduction element and use case. In some sensor devices, the ADC output can be coupled to an interface circuit 112 for conversion of the ADC output signal to a different format like pulse density modulation (PDM) or SoundWire, among others. Alternatively, the electrical circuit can output a digital signal produced by the ADC, like a PCM or $1^2$S format signal. In implementations including a capacitive transduction element, the processing circuit can include a charge pump 114 for applying a bias voltage to the transduction element 102 as show in FIG. 1. Other transduction elements, for example, piezo sensors, may not require a bias and thus the charge pump circuit is not required. The electrical circuit can also include electrical contacts for voltage, ground, data, clock, select, among other functions. The electrical circuit can be implemented as an integrated circuit, like an ASIC.

For singled-ended output transduction elements, the interface circuit can include a single-ended input to differential output low noise amplifier or unity gain buffer circuit. For sensors assemblies having multiple singled-ended output transduction elements or a single transduction element have a differential output, the interface circuit can be a low noise amplifier or buffer having differential inputs and outputs. The input impedance of the interface circuit is generally high compared to the output impedance of the transduction element to reduce signal attenuation. For capacitive transduction elements, the input capacitance of the interface circuit can be a factor of 10 less than the output capacitance of the transduction element. The input resistance of the interface circuit is generally high to reduce thermal noise and is on the order of 1 Tera-ohm or higher for microphone and other applications. The output resistance of the interface circuit can be on the order of 100 ohms for microphone applications. However these select interface impedance and resistance values are implementation-specific examples and not intended to limit the scope of the disclosure.

In FIG. 1, the transduction element 102 and electrical circuit 104 are disposed within a housing 106 to form a digital sensor assembly. The housing generally comprises a lid or cover mounted on a base comprising an external-device interface with the electrical contacts for integration with a host or other device. In some implementations, the housing can comprise a port 107 through which one or more environmental conditions (e.g., sound, pressure, humidity, etc.) outside the housing can be detected within the housing. Acoustic vibration and other sensor devices may not require a port. In other implementations, the transduction element and the processing circuit are not necessarily disposed in or integrated with a housing.

The SC delta-sigma ADC generally comprises an integrator circuit having one or more integrator stages each comprising a switched-capacitor circuit (SCC) and a plurality of amplifiers connected in parallel. Power savings are realized through a dynamic bias current scheme for the SC delta-sigma ADC during non-overlapping operating phases of the integrator circuit. The ADC has a first phase of operation during which charge sampling occurs, and a second phase of operation during which charge redistribution occurs. During the first phase of operation the integrators are in a hold phase, since there is no significant step in the current input to the amplifiers. During the first phase, amplification is not required for settling and the number of enabled amplifiers must only be sufficient to maintain charge on the output for the subsequent integrator stage. During the second phase however there is a redistribution of charge in the ADC because the output current of the DAC changes, leading to a step-wise change of the current input to the amplifier. Thus during the second phase additional amplification is required to provide sufficient settling to prevent quantization noise. Power consumption can be reduced during the first phase by disabling amplifiers not required to maintain charge on the output for the subsequent stage. During the second phase, the amplifiers disabled during the first phase are re-enabled to provide proper settling.

In one implementation, a logic circuit coupled to the integrator circuit is configured to selectably disable a subset of enabled amplifiers of the first integrator stage during the first phase and to re-enable the subset of disabled amplifiers during the second phase, wherein a number of amplifiers enabled during the first phase is less than a number of amplifiers enabled during the second phase. The number is amplifiers enabled during the second phase is based on a settling requirement of the integrator circuit for a particular operating frequency of the ADC.

Figure 2:
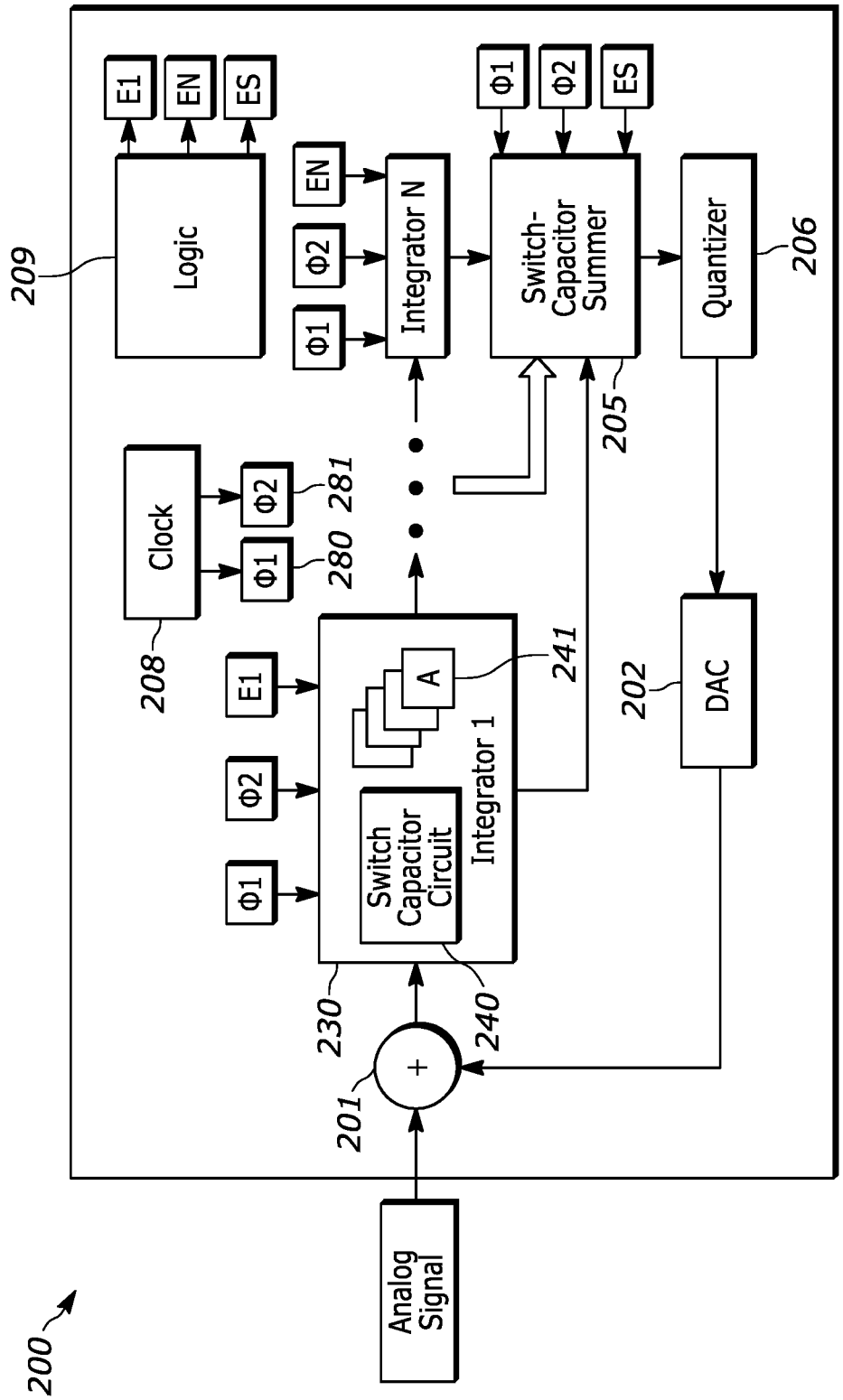
FIG. 2 is a block diagram of an example delta-sigma ADC circuit.

In FIG. 2, the SC delta-sigma ADC circuit 200 comprises an integrator circuit with a plurality of N integrator stages connected in series, wherein each integrator stage is also coupled to a switched-capacitor summer circuit (SCSC) 205. A first integrator stage 230 comprises a switched-capacitor circuit (SCC) 240 and multiple amplifiers 241 connected in parallel. In one implementation, each of the plurality of amplifiers are cascode transconductance amplifiers. The other integrator stages are configured similarly. The first integrator stage 230 integrates an analog signal and outputs the integrated signal to the switched-capacitor summer circuit (SCSC) 205. A summer circuit 201 coupled to the integrator circuit provides an analog signal to the first integrator stage 230. The analog signal is based on a combination of an analog signal obtained from the transduction element and an analog signal output by a digital-to-analog converter (DAC) circuit 202 in a feedback path of the ADC. The other integrator stages integrate signals from upstream integrator stages. The operating phases of the one or more integrator stages are controlled by a clock signal generator. In FIG. 2, the ADC includes a clock circuit 208 that generates a multiphase clock signal having a first phase signal 280 and a second phase signal 281 that control the switched-capacitor circuits of the integrator stages.

A logic circuit coupled to the integrator circuit of the ADC is configured to selectably enable a subset of amplifiers of one or more integrator stages based on the operating frequency of the ADC. During the first phase of operation, the logic circuit disables a subset of the enabled amplifiers (i.e., a second subset of amplifiers) of at least the first integrator stage and re-enables the disabled second subset of amplifiers during the second phase of operation. In FIG. 2, the ADC includes a logic circuit 209 coupled to the integrator circuit 230 and configured to output one or more control signals ($E_1 \ldots E_N$) to selectably disable and enable subsets of amplifiers of the corresponding integrator stages. The logic circuit disables a second subset of amplifiers during the first phase of operation and enables the second subset amplifiers during the second phase of operation. In this way, current and power consumption of the one or more integrator stages can be reduced.

In FIG. 2, the SCSC 205 receives the output signals from the N integrator stages and outputs a signal to a quantizer circuit 206. The quantizer circuit 206 maps (e.g., digitizes) the inputs from the integrator stages to a digital signal that can be output by the ADC, for example to the interface circuit 112 in FIG. 1. The quantizer circuit 206 is also connected to the DAC circuit 202 that is configured to generate the analog feedback signal combined, at 201 in FIG. 2, with the analog signal from the transduction element. The SCSC 205 can also include a parallel arrangement of amplifiers similar to amplifiers 241 in the first integrator stage 230 and the logic circuit 209 can selectably disable a subset of enabled amplifiers during the first phase of operation and re-enable the disabled amplifiers during the second phase of operation to reduce current consumption. The logic circuit 209 is coupled to the SCSC 205 and is configured to output a control signal ($E_S$) to selectably disable and re-enable disabled amplifiers of the SCSC 205 for this purpose.

In some implementations the first integrator stage can consume as much as 45% of the current supplied to the ADC. Thus significant power savings can be obtained by disabling a subset of enabled amplifiers of only the first integrator stage during the first phase. The first 3 integrator stages and the adder can consume as much as 65% of the current supplied to the ADC. Preliminary simulations suggest that the dynamic bias scheme disclosed herein can reduce ADC current consumption by as much as a 25%.

Figure 3:
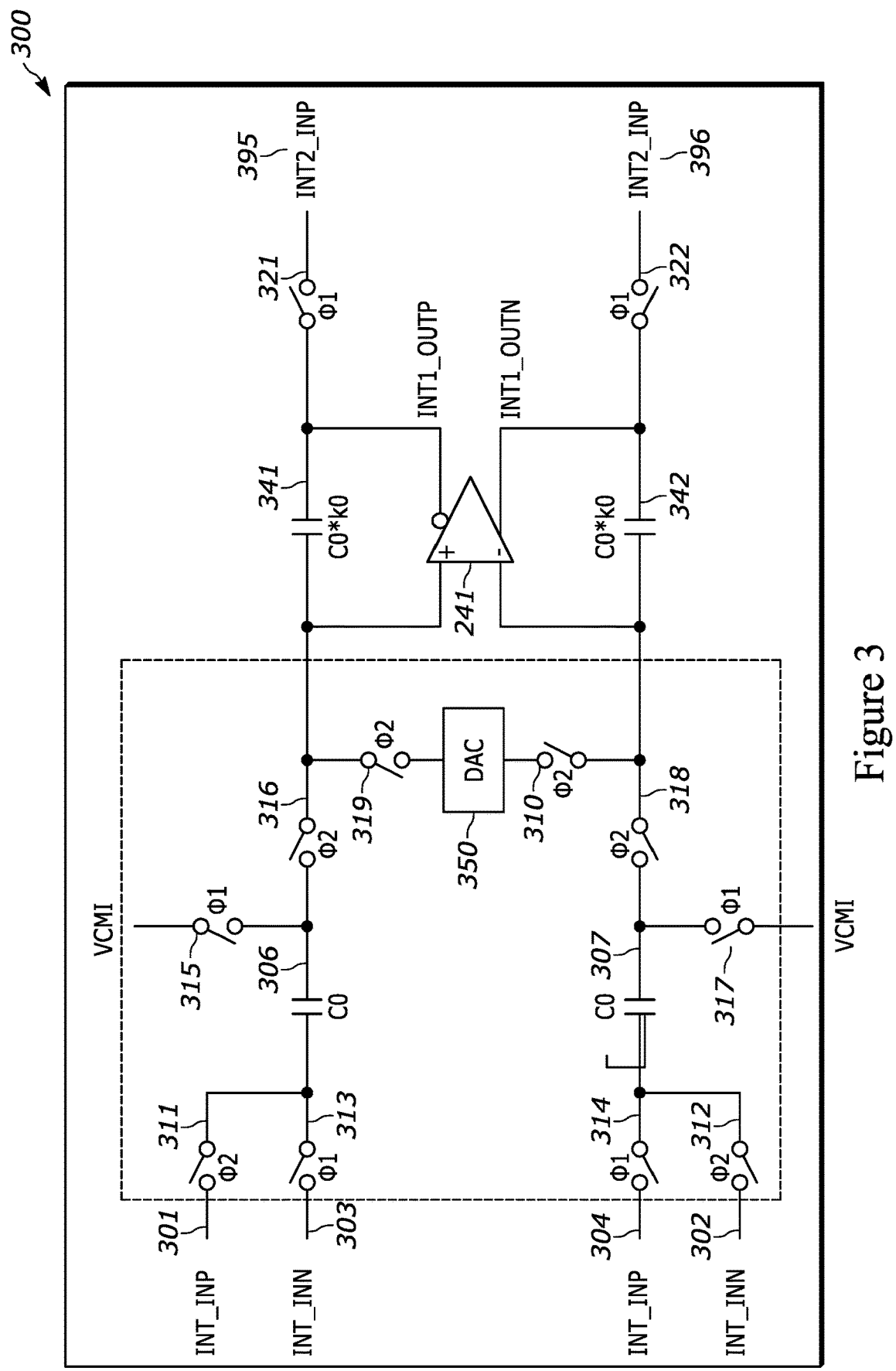
FIG. 3 is a schematic diagram depicting an example of a first integrator stage.

FIG. 3 is a schematic diagram 300 depicting a representative integrator stage, for example the first integrator stage 230 in FIG. 2. The integrator stage includes differential input terminals 301, 302, 303 and 304 coupled to a differential signal from a transduction element and selectably coupled to input capacitors 306 and 307 by switches 311, 312, 313 and 314 during the first and second operational phases. The first switch 311 and the second switch 312 are controlled by the second phase signal 281 and the third switch 313 and the fourth switch 314 are controlled by the first phase control signal 280.

A second terminal of the first capacitor 306 is connected to a reference voltage (VCMI) via fifth switch 315 that is controlled by the first phase signal 280. The first capacitor 306 is also connected to a first input terminal of the parallel amplifiers 241 via a sixth switch 316 that is controlled by the second phase signal 281. The second terminal of the second capacitor 307 is connected to the reference voltage (VCMI) via a seventh switch 317 that is controlled by the first phase signal 280. The second capacitor 307 is also connected a second input terminal of the parallel amplifiers 241 via an eighth switch 318 that is controlled by the second phase control signal 281. The first input terminal of the parallel amplifiers 241 is also connected to a first terminal of a DAC circuit 350 via a ninth switch 319 that is controlled by the second phase control signal 281 and also connected to a first output terminal of the multiple amplifiers 241 via a third capacitor 341. The second input terminal of the multiple amplifiers 241 is also connected to a second terminal of the DAC 350 via a tenth switch 310 that is controlled by the second phase control signal 281 and also connected to a second output terminal of the multiple amplifiers 241 via a fourth capacitor 342. The first output terminal of the parallel amplifiers 241 is connected to a first output terminal 395 of the first integrator stage 230 via an eleventh switch 321 that is controlled by the first phase control signal 280. The second output terminal of the parallel amplifiers 241 is connected to a second output terminal 396 via a twelfth switch 322 that is controlled by the first phase control signal 280.

Figure 5:
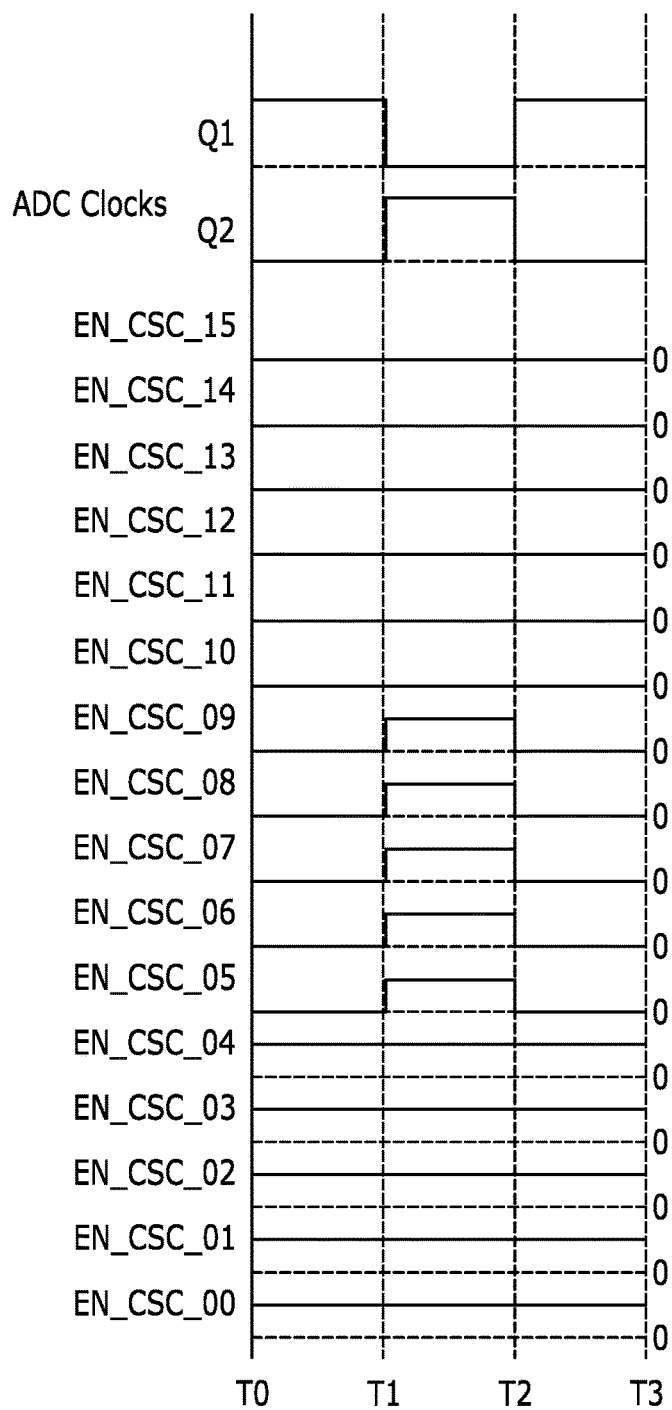
FIG. 5 is a timing diagram of multiple amplifiers of a delta-sigma ADC circuit.

During the first phase of operation, all of the switches controlled by the first phase signal 280 are closed (e.g., in a short circuit configuration) and all of the switches controlled by the second phase signal 281 are open. During the second phase of operation, all of the switches controlled by the second phase signal 281 are closed (e.g., in a short circuit configuration) and all of the switches controlled by the first phase control signal 280 are open. In the representative embodiment, the first phase signal 280 (Φ1) is in a high state (e.g., 1) and the second phase signal 281 (Φ2) is in a low state (e.g., 0) during the first phase of operation, and first phase signal 280 (Φ1) is in a low state (e.g., 0) and the second phase signal 281 (Φ2) is in a high state (e.g., 1) during the second phase, as shown in FIG. 5.

Figure 4:
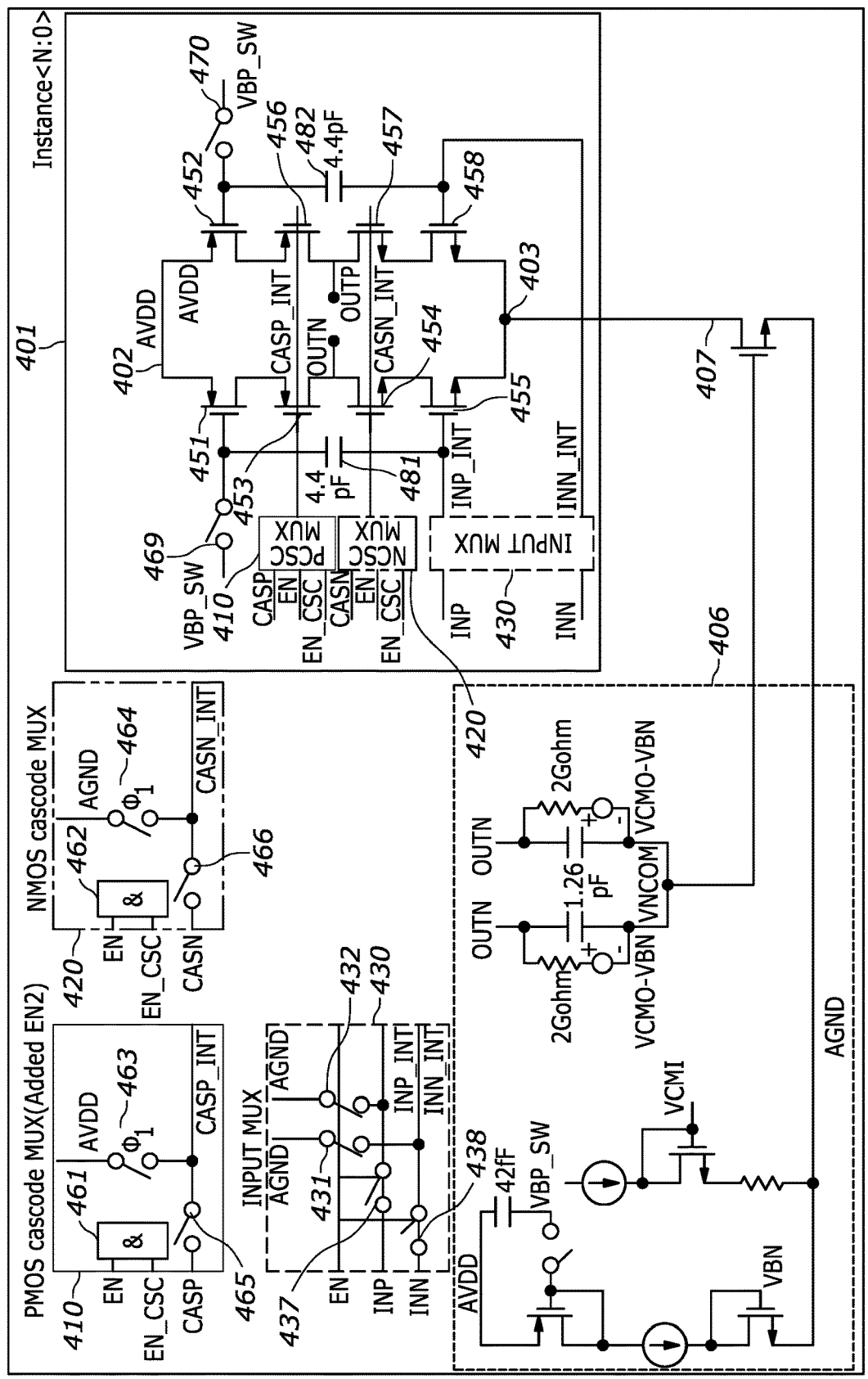
FIG. 4 is a schematic diagram of an amplifier and associated logic.

FIG. 4 depicts a schematic diagram 400 of an amplifier 401 and associated logic representative of one of the parallel amplifiers and logic of FIG. 2. In some embodiments, each integrator stage includes 16 of the amplifiers 401 connected in parallel. The associated logic includes one or more multiplexers configured to selectively enable and disable the amplifier 401. The representative logic includes a first multiplexer (MUX) 410 configured to control a first subset of one or more switches (e.g., P-MOS transistors) of the amplifier 401, a second MUX 420 configured to control a second subset of one or more switches (e.g., N-MOS transistors), and a third MUX 430 configured to control the input signal (e.g., the electrical signal input) to the amplifier 401.

In FIG. 4, the amplifier 401 includes a first terminal 402 connected to a first voltage (AVDD). The first terminal 402 is connected to a first switch 451 (e.g., a first P-MOS transistor) and to a second switch 452 (e.g., a second P-MOS transistor). The first switch 451 is connected to a third switch 453 (e.g., a third P-MOS transistor) connected to a first output terminal (OUTN) of the amplifier 401 (e.g., OUTN) and also connected to a fourth switch 454 (e.g., a first N-MOS transistor). The fourth switch 454 is connected to a fifth switch 455 (e.g., a second N-MOS transistor) connected to a second terminal 403 of the amplifier 401. The second switch 452 is connected to a sixth switch 456 (e.g., a fourth P-MOS transistor) connected to a second output terminal (OUTP) of the amplifier 401 and also connected to a seventh switch 457 (e.g., a third N-MOS transistor). The seventh switch 457 is connected to an eighth switch 458 (e.g., a fourth N-MOS transistor) connected to the second terminal 403 of the amplifier 401.

A control terminal of the third switch 453 and a control terminal of the sixth switch 456 are connected together and also connected to an output terminal (CASP_INT) of the first MUX 410. The first MUX 410 controls the state of the third and sixth switches 453 and 456. A control terminal of the fourth switch 454 and a control terminal of the seventh switch 457 are connected together and also connected to an output terminal (CASN_INT) of the second MUX 420. The second MUX 420 controls the state of the fourth and seventh switches 454 and 457. A first output terminal (INP_INT) of the third MUX 430 is connected to a control terminal of the fifth switch 455 and also connected to a control terminal of the first switch 451 via a first capacitor 481. The control terminal of the first switch is also connected to the second voltage (VPB_SW) via a ninth switch 469. A second output terminal (INN_INT) of the third MUX 430 is connected to a control terminal of the eighth switch 458 and also connected to a control terminal of the second switch 452 via a second capacitor 482. The control terminal of the second switch 452 is also connected to the second voltage (VPB_SW) via a tenth switch 470.

In FIG. 4, the first MUX 410 includes a first enable terminal (EN) and a second enable terminal (EN_CSC) connected to a first AND logic block 461 that controls the output signal on the output terminal (CASP_INT) of the first MUX 410. When the first enable signal on the first enable terminal (EN) and the second enable signal (EN_CSC) are both in a high state (e.g., 1), the first MUX 410 is enabled (e.g., switch 465 is closed) thereby allowing the output signal on the output terminal (CASP_INT) to switch between a CASP voltage and an AVDD voltage via a first switch 463 of the first MUX 410 that is controlled (e.g., turned ON and OFF) by the first phase signal 280. Similarly, the second MUX 420 includes a first enable terminal (EN) and a second enable terminal (EN_CSC) connected to a second AND logic block 462 that controls the output signal on the output terminal (CASN_INT) of the second MUX 420. The first enable terminal (EN) of the first and second MUX 410 and 420 may both be connected and the second enable terminal (EN_CSC) of the first and second MUX 410 and 420 may also be connected. When the first enable signal on the first enable terminals (EN) and the second enable signal on the second enable terminals (EN_CSC) are both in a high state (e.g., 1) the second MUX 420 is also enabled (e.g., switch 466 is closed) thereby allowing the output signal on the output terminal (CASN_INT) to switch between a CASN voltage and a AGND voltage via a first switch 464 of the second MUX 420 that is controlled (e.g., turned on and off) by the first phase control signal 280. However, if either the first enable signal or the second enable signal is in a low state (e.g., 0), then the second MUX 420 does not output a signal causing the fourth and seventh switches 454 and 457 to turn OFF, and the first MUX 410 does not output a signal causing the third and sixth switches 453 and 456 to turn OFF thereby disconnecting the first and second output terminals (OUTN and OUTP) from the amplifier 401. In other words, if one of either the first or second enable signals is in a low state, then the first and second output terminals (OUTN and OUTP) are isolated.

In FIG. 4, the third MUX 430 includes a first enable terminal (EN), a first input signal terminal (INN) and a second input signal terminal (INP). The first input terminal (INN) is connected to the first output terminal (INN_INT) via a third switch 438 and the second input terminal (INP) is connected to the second output terminal (INP_INT) via a fourth switch 437. The first enable terminal (EN) controls the first, second, third, and fourth 431, 432, 437, and 438 of the third MUX 430 that selectively applies the AGND (e.g., ground voltage) to the first and second input and output terminals of the third MUX 430 based on whether the first enable signal on the first enable terminal (EN) is in a high state (e.g., 1) or in a low state (e.g., 0). For example, when the first enable signal on the first enable terminal (EN) is high (e.g., 1), the first and second switches 431 and 432 are open and the third and fourth switches 437 and 438 are closed. Moreover, when the first enable signal on the first enable terminal (EN) is low (e.g., 0), the first and second switches 431 and 432 are closed and the third and fourth switches 437 and 438 are open. In this way, the first enable signal on the first enable terminal (EN) selectively enables or disables the amplifier 401 by either allowing or disallowing the input signals (INN) and (INP) to be applied to the amplifier 401 based on the state of the first enable signal on the first enable terminal (EN).

The first enable terminal (EN) is connected to the first enable terminals (EN) of the first and second MUXs 410 and 420. The signal on the first enable terminals (EN) for example is dependent on whether the amplifier 401 will be enabled for the first phase of operation and/or the second phase of operation. If the amplifier 401 is receiving a first enable signal at the first enable terminal (EN), then the amplifier 401 is ready to be selectively enabled and disabled in the first and/or second phases of operation. For example, if the first enable signal is applied at first enable terminals (EN), a second enable signal at the second enable terminal (EN_CSC) will determine whether the amplifier 401 is enabled or disabled. However, if the first enable signal is not applied at the first enable terminals (EN), then the amplifier 401 will be disabled regardless of the signal at the second enable terminal (EN_CSC). The signal applied at the second enable terminal (EN_CSC) may be phase dependent. For example, the signal at the second enable terminal (EN_CSC) may be applied during the second phase of operation (e.g., a second phase signal 281 is high) to enable the amplifier 401 and/or removed during the first phase of operation (e.g., a first phase signal 280 is high) to disable the amplifier 401 during the first phase. Other schemes can also be used to enable and disable the amplifiers.

The amplifier 401 may also include various biasing circuitry 406 configured to bias the amplifier 401. The biasing circuit 406 may for example be connected to the second terminal of the amplifier 401 via a biasing switch 407 (e.g., biasing N-MOS transistor).

Beneficially, the use of the MUXs 410, 420, 430 and the first and second AND logic blocks 461, 462 do not require extra switches to implement the ADC described herein. For example, when the first enable signal on the first enable terminal (EN) is high and the second enable signal is high, the amplifier 401 is enabled such that the input signals (INP and INN) are received by the amplifier 401 and amplified output signals (OUTP and OUTN) are output.

FIG. 5 depicts a timing diagram 500 for control of parallel amplifiers in an integrator stage of the ADC, for example the multiple amplifiers 241 of the first integrator stage 230 in FIG. 2. The timing diagram of FIG. 5 is also applicable to the parallel amplifiers in the other integrator stages and to the parallel amplifier in the SCSC circuit of the integrator described herein.

In FIG. 5, the timing diagram 500 includes a first phase signal ($\Phi$1) and a second phase signal $\Phi$2). The timing diagram 500 also includes enable signals (EN_CSC) for 16 different amplifiers (e.g., 00-15) corresponding to the parallel amplifiers of an integrator stage described herein. The enable signals are selectably applied to enable terminals of the respective amplifiers 00-15. When the first phase signal ($\Phi$1) is in a high state, the second phase signal ($\Phi$2) is in a low state and the sensor assembly is the first phase of operation depicted between a first time (T0) and a second time (T1) and again between a third time (T2) and a fourth time (T3). When the first clock signal ($\Phi$1) is in a low state, the second clock signal ($\Phi$2) is in a high state and the sensor assembly is in the second phase of operation such as depicted between the second time (T1) and the third time (T2).

As described herein, each of the parallel amplifiers of the integrator stage may be selectably enabled or disabled during the operating phases of the integrator circuit and in some embodiments in the switched-capacitor summer circuit. In FIG. 5, a first subset of amplifiers (i.e., amplifiers 00-09) are enabled during both the first and second phases of operation. In order to reduce current draw, a second subset of amplifiers (i.e., amplifiers 05-09) are disabled during the first phase of operation. In FIG. 5, some amplifiers (i.e., amplifiers 10-15) are disabled during both phases of operation. The number of enabled amplifiers depends generally on the sampling rate and integrator settling requirements. In implementations having a higher sampling and a reduced settling time requirements, more of the 16 amplifiers can be enabled during the second phase of operation. In some embodiments, a formula or lookup table may be used by the processor to determine the number of amplifiers that should be enabled to satisfy a particular performance requirement.

Figure 6:
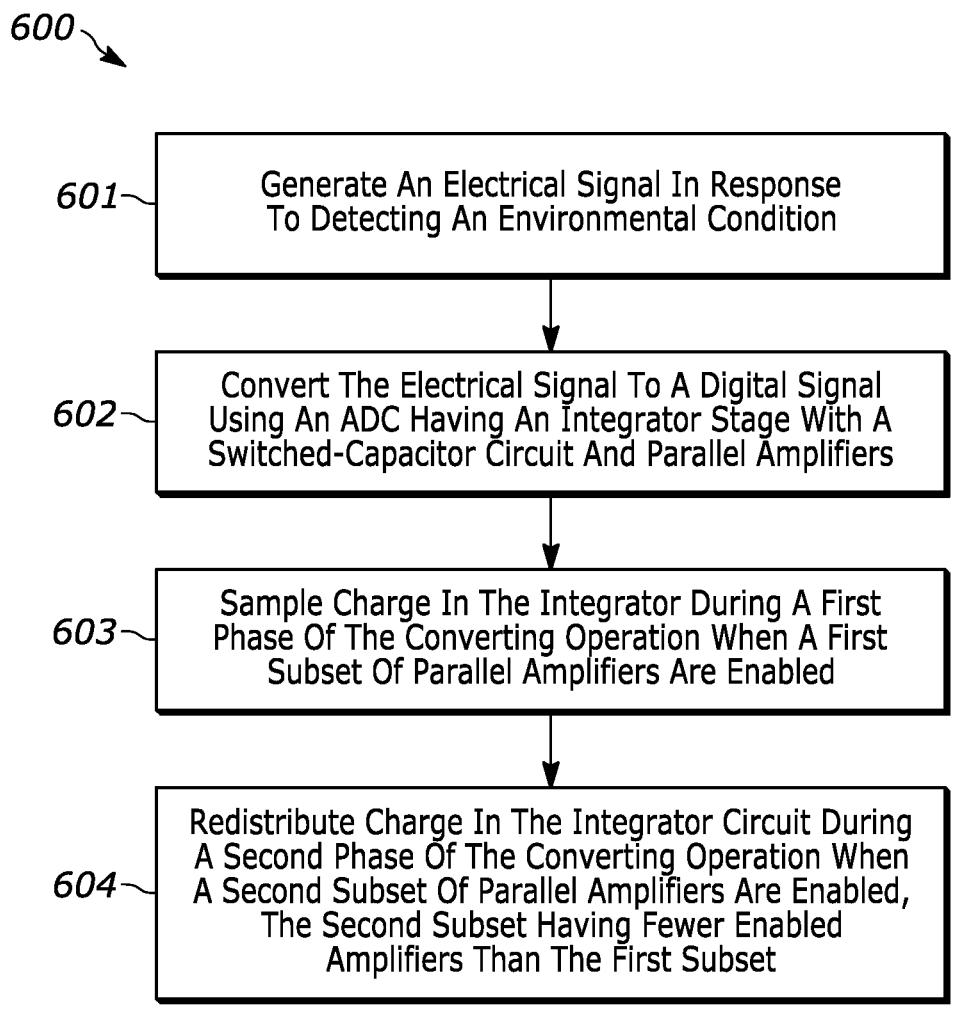
FIG. 6 is a flow diagram of a method of operating a digital micro-electromechanical systems (MEMS) microphone assembly having a delta-sigma ADC circuit.

FIG. 6 depicts a flow diagram of a method 600 of operating a digital MEMS microphone assembly, for example, a microphone assembly as depicted in FIG. 1. At 601, the transduction element of the sensor assembly generates an electrical signal in response to detecting an environmental condition. The electrical signal is output to the integrated circuit having an ADC as described herein. At 602, the integrated circuit converts the electrical signal into a digital signal. At 603, charge sampling occurs in the integrator during a first phase of the converting operation when a first subset of parallel amplifiers are enabled. At 604, charge redistribution occurs in the integrator circuit during a second phase of the converting operation when a second subset of parallel amplifiers are enabled, the second subset having fewer enabled amplifiers than the first subset. In one implementation, the first subset is a subset of the second subset. The number of amplifiers enabled during the second phase can be based on a settling requirement of the ADC for a particular sampling frequency. As described, an output of each of the plurality of integrator stages can be summed in a switched-capacitor summer comprising a plurality of amplifiers connected in parallel, wherein a number of enabled amplifiers in the switched-capacitor summer during the second phase is greater than during the first phase. The first and second subsets can be enabled by applying a first enable signal and a second enable signal to the respective amplifiers during the respective first and second phases.

During the first phase of operation, a first subset of amplifiers are enabled and during the second phase of operation a second subset of amplifiers are enabled, wherein the number of enabled amplifiers in the second subset is greater than the number in the first subset.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A sensor assembly comprising:
   a transduction element configured to generate an electrical signal in response to detecting an environmental condition;

an integrated circuit comprising a delta-sigma analog-to-digital converter (ADC) coupled to the transduction element and configured to convert the electrical signal into a digital signal, the ADC comprising an integrator circuit including a first integrator stage comprising a switched-capacitor circuit (SCC) and a first plurality of amplifiers connected in parallel, the first integrator stage having a first phase of operation during which charge sampling occurs and a second phase of operation during which charge redistribution occurs; and a logic circuit coupled to the integrator circuit and configured to selectably disable a subset of enabled amplifiers of the first integrator stage during the first phase and to re-enable the subset of disabled amplifiers during the second phase.

2. The assembly of claim 1, wherein the enabled amplifiers correspond to a number of enabled amplifiers required to satisfy a settling requirement of the ADC during the second phase.

3. The assembly of claim 2, wherein the number of enabled amplifiers is based on an operating frequency of the ADC.

4. The assembly of claim 2, wherein the number of enabled amplifiers is less than or equal to a number of amplifiers in the first plurality of amplifiers.

5. The assembly of claim 2, wherein each of the first plurality of amplifiers are cascode transconductance amplifiers.

6. The assembly of claim 1 further comprising a switched-capacitor summer circuit comprising a plurality of amplifiers connected in parallel, the integrator circuit including a plurality of cascaded integrator stages, each integrator stage comprising a switched-capacitor circuit (SCC) and a plurality of amplifiers connected in parallel, wherein the output of each of the plurality of integrator stages is coupled to the switched-capacitor summer circuit.

7. The assembly of claim 6, wherein the logic circuit is configured to selectably disable a subset of enabled amplifiers in each integrator stage and in the switched capacitor summer circuit during the first phase and to re-enable the subset of disabled amplifiers during the second phase.

8. The assembly of claim 7, wherein each of the plurality of amplifiers are cascode transconductance amplifiers.

9. The assembly of claim 7, wherein the enabled amplifiers correspond to a number of enabled amplifiers required to satisfy a settling requirement of the ADC during the second phase.

10. An integrated circuit for a sensor assembly, the integrated circuit comprising:

a delta-sigma analog-to-digital converter (ADC) configured to convert an electrical signal generated by a transconductance element of a sensor assembly into a digital signal when the integrated circuit is coupled to the transconductance element, the ADC comprising an integrator circuit including a first integrator stage comprising a switched-capacitor circuit (SCC) and a first plurality of amplifiers connected in parallel, the first integrator stage having a first phase of operation during which charge sampling occurs and a second phase of operation during which charge redistribution occurs; and a logic circuit coupled to the integrator circuit and configured to selectably disable a subset of enabled amplifiers of the first integrator stage during the first phase and to re-enable the subset of disabled amplifiers during the second phase.

11. The circuit of claim 10 further comprising a switched-capacitor summer circuit comprising a plurality of amplifiers connected in parallel, the integrator circuit including a plurality of cascaded integrator stages, each integrator stage comprising a switched-capacitor circuit (SCC) and a plurality of amplifiers connected in parallel, wherein the output of each of the plurality of integrator stages is coupled to the switched-capacitor summer circuit.

12. The circuit of claim 11, wherein the enabled amplifiers correspond to a number of enabled amplifiers required to satisfy a settling requirement of the ADC during the second phase.

13. The circuit of claim 12, wherein the number of enabled amplifiers is less than or equal to a number of amplifiers in the first plurality of amplifiers.

14. The circuit of claim 12, wherein the logic circuit is configured to selectably disable a subset of enabled amplifiers in each integrator stage and in the switched capacitor summer circuit during the first phase and to re-enable the subset of disabled amplifiers during the second phase.

15. The circuit of claim 12 in combination with a sensor assembly comprising a transconduction element coupled to the ADC.

16. A method of operating a digital sensor assembly, the method comprising:

generating an electrical signal with a transconduction element upon detection of an environmental condition;

converting the electrical signal to a digital signal with a delta-sigma analog-to-digital converter (ADC) comprising a plurality of integrator stages having a switched-capacitor circuit and a plurality of parallel amplifiers, the converting including:

performing charge sampling in a first integrator stage during a first phase when a first subset of the plurality of parallel amplifiers of the first integrator stage are enabled; and redistributing charge in the first integrator stage during a second phase when a second subset of the plurality of parallel amplifiers of the first integrator stage are enabled, wherein first subset has fewer enabled amplifiers than the second subset.

17. The method of claim 16 further comprising enabling the number of amplifiers in the second subset based on a settling requirement of the ADC during the second phase, wherein the first subset is a subset of the second subset.

18. The method of claim 17, enabling the number of amplifiers in the second subset based on a sampling frequency of the ADC.

19. The method of claim 16, summing an output of each of the plurality of integrator stages in a switched-capacitor summer circuit comprising a plurality of amplifiers connected in parallel, wherein a number of enabled amplifiers in the switched-capacitor summer circuit during the second phase is greater than a number of enabled amplifiers during the first phase.

20. The method of claim 16, generating the electrical signal upon detection of an acoustic signal.

* * * * *